(12) United States Patent
Balboni

(10) Patent No.: US 8,493,102 B2
(45) Date of Patent: Jul. 23, 2013

(54) DIFFERENTIAL CURRENT BUFFER

(75) Inventor: Edmund Balboni, Littleton, MA (US)

(73) Assignee: Analog Devices, Inc., Norwood, MA (US)

( * ) Notice: Subject to any disclaimer, the term of this patent is extended or adjusted under 35 U.S.C. 154(b) by 12 days.

(21) Appl. No.: 13/271,991

(22) Filed: Oct. 12, 2011

(65) Prior Publication Data
US 2013/0093494 A1 Apr. 18, 2013

(51) Int. Cl.
*H03B 1/00* (2006.01)
(52) U.S. Cl.
USPC ............... 327/108; 327/67; 326/82
(58) Field of Classification Search
USPC ............ 327/65, 67, 108; 326/82–87, 89–91
See application file for complete search history.

(56) References Cited

U.S. PATENT DOCUMENTS

| | | | |
|---|---|---|---|
| 4,347,446 A * | 8/1982 | Price | 326/90 |
| 6,847,225 B2 * | 1/2005 | Viehmann et al. | 326/30 |
| 7,405,593 B2 * | 7/2008 | Tzartzanis et al. | 326/82 |
| 7,522,671 B2 * | 4/2009 | Kiamilev et al. | 375/257 |

* cited by examiner

*Primary Examiner* — William Hernandez
(74) *Attorney, Agent, or Firm* — Knobbe Martens Olson & Bear LLP

(57) ABSTRACT

Apparatus and methods provide a differential current buffer. The current buffer has cross-coupled feedback and offers relatively good common-mode rejection and a relatively low and linear input impedance, which can reduce intermodulation distortion. The current buffer can be used in, for example, an RF modulator, such as a quadrature modulator.

29 Claims, 4 Drawing Sheets

DIFFERENTIAL CURRENT BUFFER

BACKGROUND

1. Field of the Invention

The invention generally relates to electronics, and in particular, to communications circuits.

2. Description of the Related Art

Communications circuits can exhibit certain input characteristics and certain output characteristics. For example, some devices may have current outputs, while others may have voltage outputs. Some devices may have current-driven inputs, whereas other devices may have voltage-driven inputs. Even when the input and output characteristics of devices apparently match, buffering may be used because of non-linearity in the input and/or output characteristics.

For example, a filter can be sensitive to the non-linearity of a load, such as a mixer. A buffer circuit can be used to isolate the non-linearity of the load from the filter, which could otherwise cause intermodulation distortion. Intermodulation distortion is typically an undesirable characteristic, as it can corrupt the spectrum and decrease the number of channels that can be carried by a signal to maintain a particular signal to noise ratio.

Thus, buffering circuits are relatively common in electronic circuits. Some buffering circuits can also convert from voltage to current or from current to voltage. Other buffering circuits simply buffer current or voltage.

FIG. 1 illustrates an example of a conventional buffer circuit 100. The buffer circuit 100 receives currents $I_{ip}$, $I_{in}$ as inputs and generates currents $I_{op}$, $I_{on}$ as outputs. The buffer circuit 100 has resistors $R_i$ 102, 104, transistors Q1-Q4, resistors Re 106, 108, and current sources 110, 112. The resistors $R_i$ 102, 104 form a current-to-voltage converter. The transistors Q1-Q4, the resistors $R_e$ 106, 108, and the current sources 110, 112 form a voltage-to-current converter.

The current-to-voltage conversion operates as follows. The current through the bases of the transistors Q3, Q4 is negligible compared to the current through the resistors Ri 102, 104. Thus, the input currents $I_{ip}$, $I_{in}$ flow through the resistors $R_i$ 102, 104. The voltage drop across the resistors $R_i$ 102, 104 converts the input currents $I_{ip}$, $I_{in}$ to the voltages $V_{ip}$, $V_{in}$.

The voltage-to-current conversion operates as follows. A voltage loop from the base of the transistor Q4, to the emitter of the transistor Q4, to the base of the transistor Q2, to the emitter of the transistor Q2, and across the resistor $R_e$ 106 is considered. The voltage at the base of the transistor Q4 is the voltage $V_{ip}$. The base to emitter of the transistor Q4 adds a $V_{BE}$ voltage, and the base to emitter of the transistor Q2 subtracts a $V_{BE}$ voltage. The circuit can be designed such that the two $V_{BE}$ voltages approximately match and thus cancel. The voltage $V_{ip}$ then appears across the resistor $R_e$ 106, which then passes a current of the voltage Vip divided by the resistance $R_e$. Assuming that the collector current $I_{op}$ of the transistor Q2 is about the same as the emitter current of Q2, which flows through the resistor Re 106, then the collector current $I_{op}$ is approximately equal to the voltage Vip divided by the resistance Re. The approximate relationship between the output current $I_{op}$ and the input current $I_{ip}$ is expressed in Eq. 1.

$$I_{op} = \frac{V_{op}}{R_e} = \frac{I_{ip}R_i}{R_e} \quad \text{Eq. 1}$$

The currents $I_{in}$, $I_{on}$ and the voltage $V_{in}$ can be analyzed in the same manner. The current sources 110, 112 provide biasing for operation.

SUMMARY OF THE DISCLOSURE

The invention includes a differential current buffer. The current buffer has cross-coupled feedback and offers relatively good common-mode rejection and a relatively low and linear input impedance, which can reduce intermodulation distortion. The current buffer can be used in, for example, a radio frequency (RF) modulator, such as a quadrature modulator.

One embodiment includes an apparatus, which includes: a first current buffer comprising: a first input configured to receive a non-inverted input signal current; a second input configured to receive an inverted input signal current; a first transistor of a first type, the first transistor having a base, an emitter, and a collector or a gate, a source, and a drain, wherein the base or gate of the first transistor is coupled to the first input; a second transistor of the first type, the second transistor having a base, an emitter, and a collector or a gate, a source, and a drain, wherein the base or gate of the second transistor is coupled to the second input; a first current source having an end coupled to the emitter or source of the first transistor; a second current source having an end coupled to the emitter or source of the second transistor; a first resistor having a first end coupled to the base or gate of the first transistor and a second end coupled to a reference voltage; a second resistor having a first end coupled to the base or gate of the second transistor and a second end coupled to the reference voltage; a third transistor of a second type different from the first type, the third transistor having a base, an emitter, and a collector or a gate, a source, and a drain, wherein the base or gate of the third transistor is coupled to the emitter or source of the first transistor, wherein the emitter or source of the third transistor is coupled to the base or gate of the second transistor, wherein the collector or drain of the third transistor is configured to provide a non-inverted output current signal; and a fourth transistor of the second type, the fourth transistor having a base, an emitter, and a collector or a gate, a source, and a drain, wherein the base or gate of the fourth transistor is coupled to the emitter or source of the second transistor, wherein the emitter or source of the fourth transistor is coupled to the base or gate of the first transistor, wherein the collector or drain of the fourth transistor is configured to provide an inverted output current signal.

One embodiment includes an apparatus, which includes: a first current buffer comprising: a first buffer circuit comprising at least an input stage cascaded with an output stage, wherein the input stage has a first input node configured to receive a non-inverted input signal current of a differential input signal, wherein the output stage has a low-impedance node and a first output node, wherein the output stage is configured to generate a non-inverted output signal at the first output node; a second buffer circuit comprising at least an input stage cascaded with an output stage, wherein the input stage has a second input node configured to receive an inverted input signal current of the differential input signal, wherein the output stage has a low-impedance node and a second output node, wherein the output stage is configured to generate an inverted output signal at the second output node; and a cross-coupled feedback circuit configured to connect the low-impedance node of the second buffer circuit to the first input node and to connect the low-impedance node of the first buffer circuit to the second input node such that the first node and the second node are configured to have input impedances less than input impedances without the presence of the cross-coupled feedback circuit.

One embodiment includes an apparatus, which includes: a first current buffer comprising: a first buffer circuit comprising at least an input stage cascaded with an output stage, wherein the input stage has a first input node configured to receive a non-inverted input signal current of a differential input signal, wherein the output stage has a low-impedance node and a first output node, wherein the output stage is configured to generate a non-inverted output signal at the first output node; a second buffer circuit comprising at least an input stage cascaded with an output stage, wherein the input stage has a second input node configured to receive an inverted input signal current of the differential input signal, wherein the output stage has a low-impedance node and a second output node, wherein the output stage is configured to generate an inverted output signal at the second output node; and a means for cross-coupling feedback from the low-impedance node of the second buffer circuit to the first input node and from the low-impedance node of the first buffer circuit to the second input node such that an input impedance of the first node and an input impedance of the second node are less than the input impedances without the presence of the cross-coupled feedback circuit.

One embodiment includes a method for buffering current, the method including: receiving a non-inverted input signal current of a differential input signal at a first input node of an input stage of a first buffer circuit, wherein the first buffer circuit further comprises an output stage cascaded with the input stage, wherein the output stage has a low-impedance node and a first output node; generating a non-inverted output signal at the first output node from the non-inverted input signal current; receiving an inverted input signal current of the differential input signal at a second input node of an input stage of a second buffer circuit, wherein the second buffer circuit further comprises an output stage cascaded with the input stage, wherein the output stage has a low-impedance node and a second output node; generating an inverted output signal at the second output node from the inverted input signal current; and cross-coupling feedback from the low-impedance node of the second buffer circuit to the first input node and from the low-impedance node of the first buffer circuit to the second input node such that an input impedance of the first node and an input impedance of the second node are less than the input impedances without the presence of the cross-coupled feedback circuit.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Figure 1:
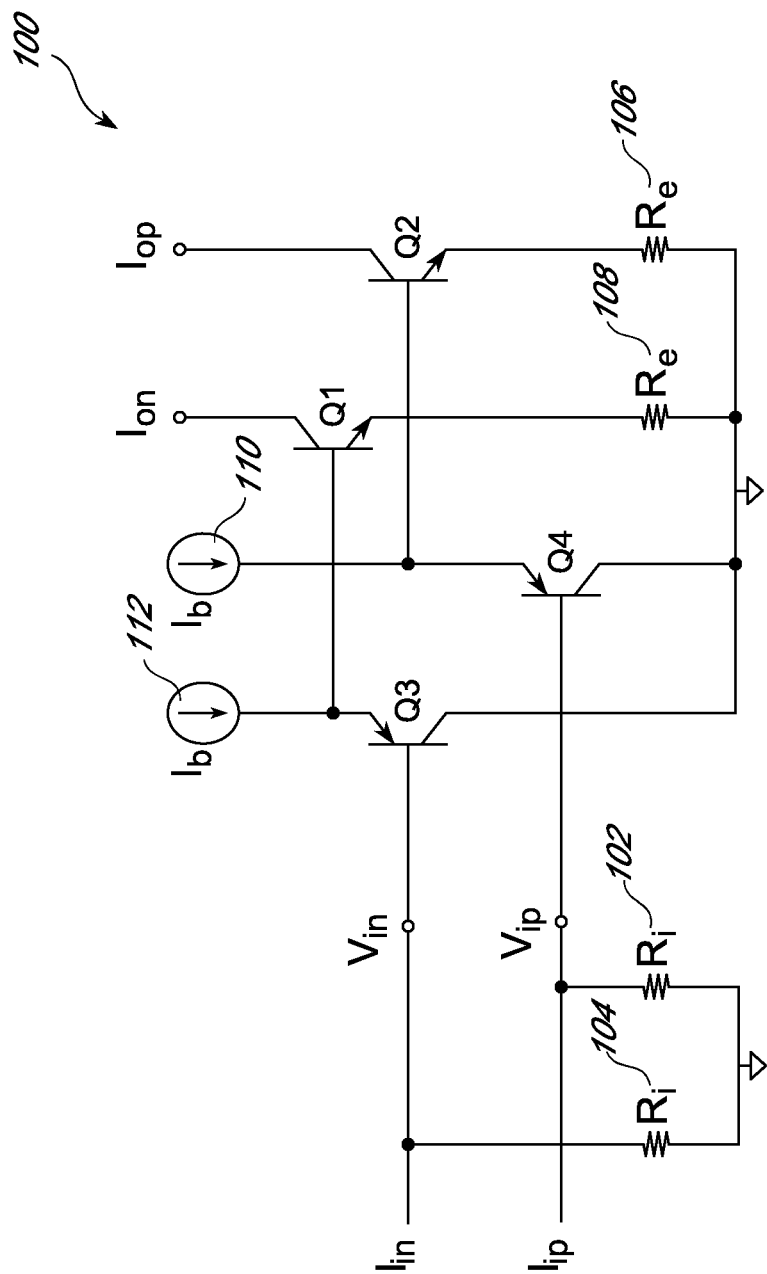
FIG. 1 illustrates an example of a conventional buffer circuit.

Although particular embodiments are described herein, other embodiments of the invention, including embodiments that do not provide all of the benefits and features set forth herein, will be apparent to those of ordinary skill in the art. In this description, reference is made to the drawings in which like reference numerals indicate identical or functionally similar elements.

Figure 2:
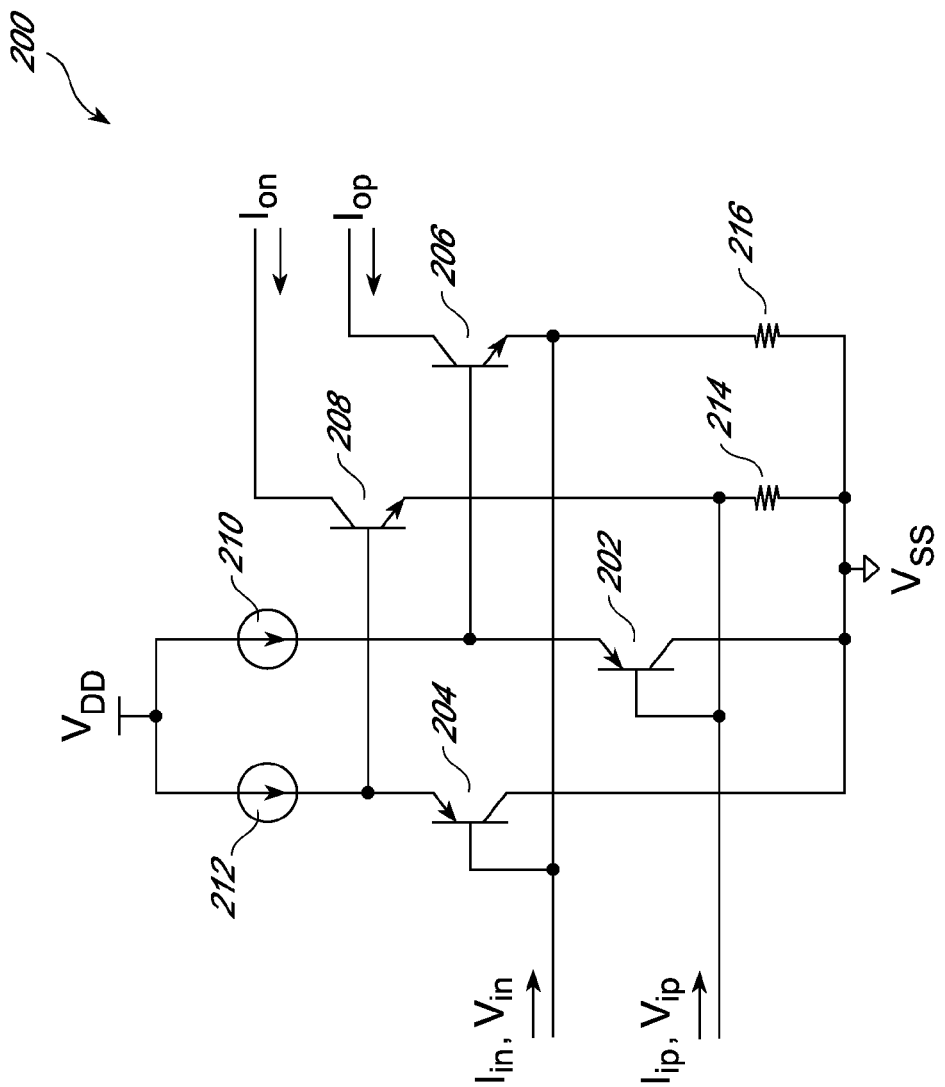
FIG. 2 illustrates a current buffer according to an embodiment of the invention.

FIG. 2 illustrates a current buffer 200 according to an embodiment of the invention. The illustrated current buffer 200 includes a first PNP bipolar transistor 202, a second PNP bipolar transistor 204, a first NPN bipolar transistor 206, a second NPN bipolar transistor 208, a first current source 210, a second current source 212, a first resistor 214, and a second resistor 216. In the illustrated embodiment, the resistors $R_i$ 102, 104 (FIG. 1) are not present, which helps to reduce thermal noise.

In one embodiment, the bipolar transistors are fabricated using a silicon-germanium process. An alternative mirror image embodiment is also applicable and can be implemented by exchanging the PNP bipolar transistors for NPN bipolar transistors, exchanging the NPN bipolar transistors for PNP bipolar transistors, reversing the direction of the current sources, and exchanging the voltage supplies $V_{DD}$ and $V_{SS}$. In addition, while illustrated in the context of bipolar transistors, the principles and advantages described herein are also applicable to MOS transistors, wherein PMOS transistors are substituted for the PNP bipolar transistors and NMOS transistors are substituted for the NPN bipolar transistors for either the illustrated embodiment or the alternative mirror image embodiment such that a gate, a source, and a drain of a MOS transistor substitutes for a base, emitter, and a collector of a bipolar transistor. In addition to silicon bipolar transistors, the principles and advantages described herein are also applicable to heterojunction bipolar transistors (HBTs), such as GaAs HBTs and InP HBTs.

Certain components should be matched. Pairs that should be matched include the first PNP bipolar transistor 202 and the second PNP bipolar transistor 204, the first NPN bipolar transistor 206 and the second NPN bipolar transistor 208, the first current source 210 and the second current source 212, and the first resistor 214 and the second resistor 216. In addition, the base-emitter voltage $V_{BE}$ drops of the NPN transistors and the PNP transistors should approximately match for relatively good cancellation of the base-emitter voltage $V_{BE}$ drops.

Returning now to the illustrated embodiment, the current buffer 200 has a first input receiving a non-inverted input signal with current $I_{IP}$ and voltage $V_{IP}$, a second input receiving an inverted input signal with current $I_{IN}$ and voltage $V_{IN}$, and generates a non-inverted output current signal $I_{OP}$ and an inverted output current signal $I_{ON}$.

The base of the first PNP bipolar transistor 202 is coupled to the first input. The emitter of the first PNP bipolar transistor 202 is coupled to a first end the first current source 210 and to the base of the first NPN bipolar transistor 206. The second end of the first current source 210 is coupled to a power supply voltage $V_{DD}$, which can be, for example, about 5 volts. The collector of the first PNP bipolar transistor 202 is coupled to the power supply voltage $V_{SS}$, which can be ground.

The base of the second PNP bipolar transistor 204 is coupled to the second input. The emitter of the second PNP bipolar transistor 204 is coupled to a first end of the second current source 212 and to the base of the second NPN bipolar transistor 208. The second end of the second current source 212 is coupled to a power supply voltage $V_{DD}$. The collector of the first PNP bipolar transistor 202 is coupled to the power supply voltage $V_{SS}$, which can be ground.

The emitter of the second NPN bipolar transistor 208 is coupled to a first end of the first resistor 214, and the collector of the second NPN bipolar transistor 208 provides the inverted output current signal $I_{ON}$. The emitter of the first NPN bipolar transistor 206 is coupled to a first end of the second resistor 216, and the collector of the first NPN bipolar transistor 206 provides the non-inverted output current signal $I_{OP}$.

In addition, the node that connects the emitter of the second NPN bipolar transistor 208 and the first end of the first resistor 214 is cross-coupled to the first input node, which includes the base of the first PNP bipolar transistor 202. The node that connects the emitter of the first NPN bipolar transistor 206 and the first end of the second resistor 216 is cross-coupled to the second input node, which includes the base of the second PNP bipolar transistor 204. This cross-coupling is new and the operation of the new circuit configuration is described as follows.

For the following analysis, each of the first resistor 214 and the second resistor 216 are assumed to have the same resistance $R_E$. In one embodiment, the value of the resistance $R_E$ is about 25 ohms. However, the value of the resistance $R_E$ can vary in a very broad range and can be, for example, in a range from about 1 to 10,000 ohms, alternatively from about 5 ohms to about 5,000 ohms, or alternatively in a range of about 2 ohms to about 2,000 ohms. The power supply voltage $V_{SS}$ is assumed to be ground. The current sources 210, 212 are matched, the PNP transistors 202, 204 are matched, and the NPN transistors 206, 208 are matched. In addition, base currents of the transistors 202, 204, 206, 208 are considered to be negligible.

The voltages $V_{IP}$ and $V_{IN}$ at the input nodes should be defined by the voltage drops across the first resistor 214 and the second resistor 216, respectively. Ignoring base currents, the voltages $V_{IP}$ and $V_{IN}$ are then as expressed in Eq. 2 and Eq. 3.

$$V_{IP}=(I_{IP}+I_{ON})R_E \qquad \text{Eq. 2}$$

$$V_{IN}=(I_{IN}+I_{OP})R_E \qquad \text{Eq. 3}$$

Eq. 4 expresses the voltage around the loop from the second input node with voltage $V_{IN}$ to the first input node with voltage $V_{IP}$. A positive base-emitter voltage is encountered from the base to the emitter of the second PNP transistor 204, then a negative base to emitter voltage is encountered from the base to the emitter of the second NPN bipolar transistor 208, and then the loop encounters the first input node with voltage $V_{IP}$, as expressed in Eq. 4. The positive and the negative base-emitter voltages should at least approximately cancel out, and it can be observed that the input voltage $V_{IP}$ at the first input node and the input voltage VIN at the second input node $V_{IN}$ should be about equal.

$$V_{IN}=V_{BE}-V_{BE}+V_{IP}=V_{IP} \qquad \text{Eq. 4}$$

Since the input voltages $V_{IP}$, $V_{IN}$ are equal, the expressions to the right in Eq. 2 and Eq. 3 are also equal, as expressed in Eq. 5.

$$(I_{IN}+I_{OP})R_E=(I_{IP}+I_{ON})R_E \qquad \text{Eq. 5}$$

Eq. 5 simplifies to Eq. 6.

$$I_{IN}+I_{OP}=I_{IP}+I_{ON} \qquad \text{Eq. 6}$$

Rearranging terms, it can be observed that the differential output current $I_{OP}$ minus $I_{ON}$ is equal to the differential input current $I_{IP}$ minus $I_{IN}$, as expressed in Eq. 7. As illustrated in Eq. 7, the current buffer 200 exhibits relatively good common mode signal rejection characteristics.

$$I_{OP}-I_{ON}=I_{IP}-I_{IN} \qquad \text{Eq. 7}$$

Figure 3:
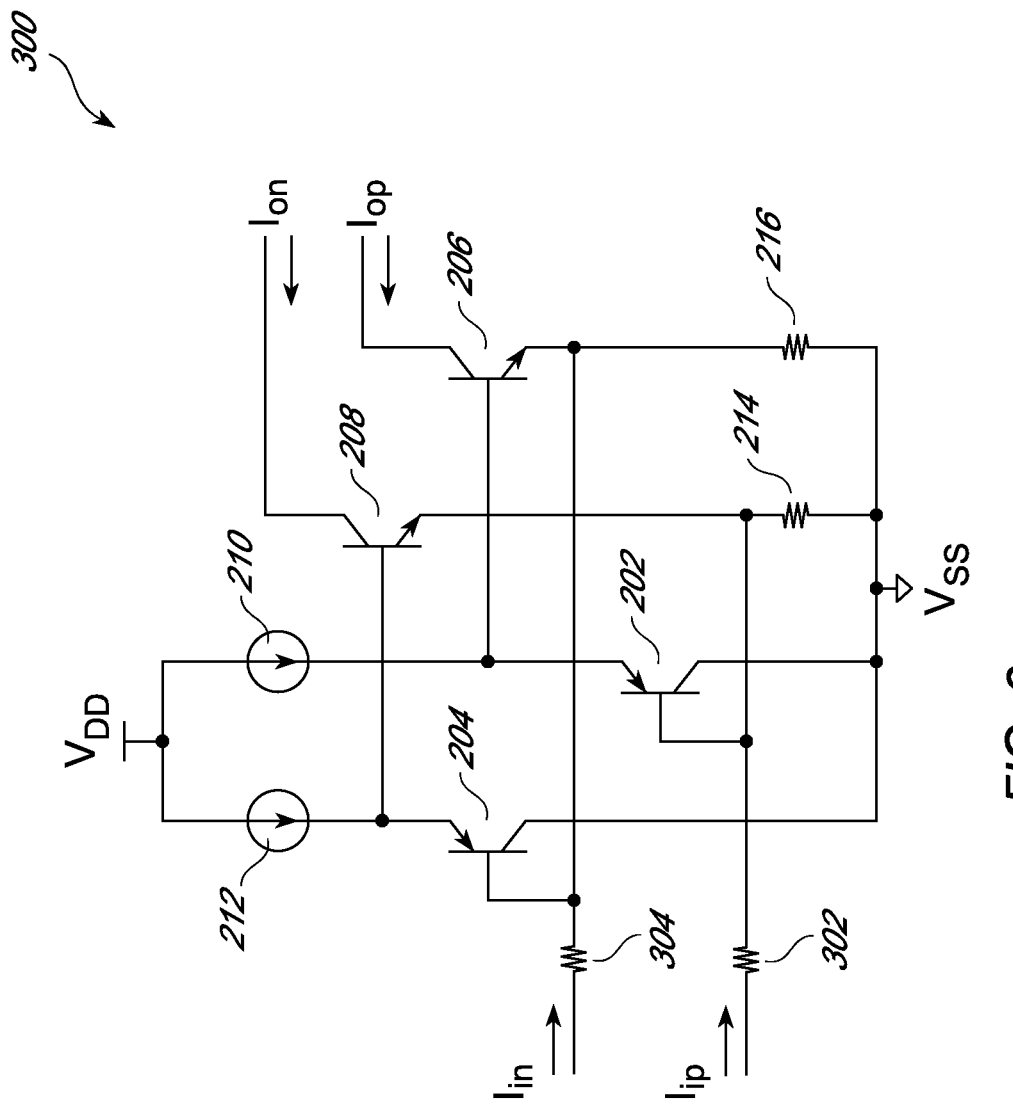
FIG. 3 illustrates an enhancement to the current buffer of FIG. 2.

FIG. 3 illustrates an enhanced current buffer 300. In the enhanced current buffer 300, the resistors 302, 304 are added to the current buffer 200. The resistors 302, 304 should be matched to each other. An ideal characteristic for a current buffer would be for the input to look like a short circuit. However, it can sometimes be more important to have a linear input impedance rather than the lowest possible input impedance. For example, an LC filter can be provided at outputs of a digital-to-analog converter with current outputs, and the filtered current can be provided as an input to the current buffer 300. Non-linearities in the input impedance of the current buffer 300 can result in intermodulation distortion, and the addition of some real resistance increases the linearity of the input impedance, thereby decreasing intermodulation distortion. In one embodiment, the resistors 302, 304 have a resistance of about 2.5 ohms each. Other values for the resistance can be used and will be readily determined by one of ordinary skill in the art. For example, a range of resistance from about 1 ohm to about 100 ohms can be applicable. In another example, the resistors 302, 304 have a resistance in the range of about 1 ohm to about 10 ohms. In addition, it should be noted that the resistors 302, 304 correspond to explicit resistance and not to mere parasitic resistance.

Figure 4:
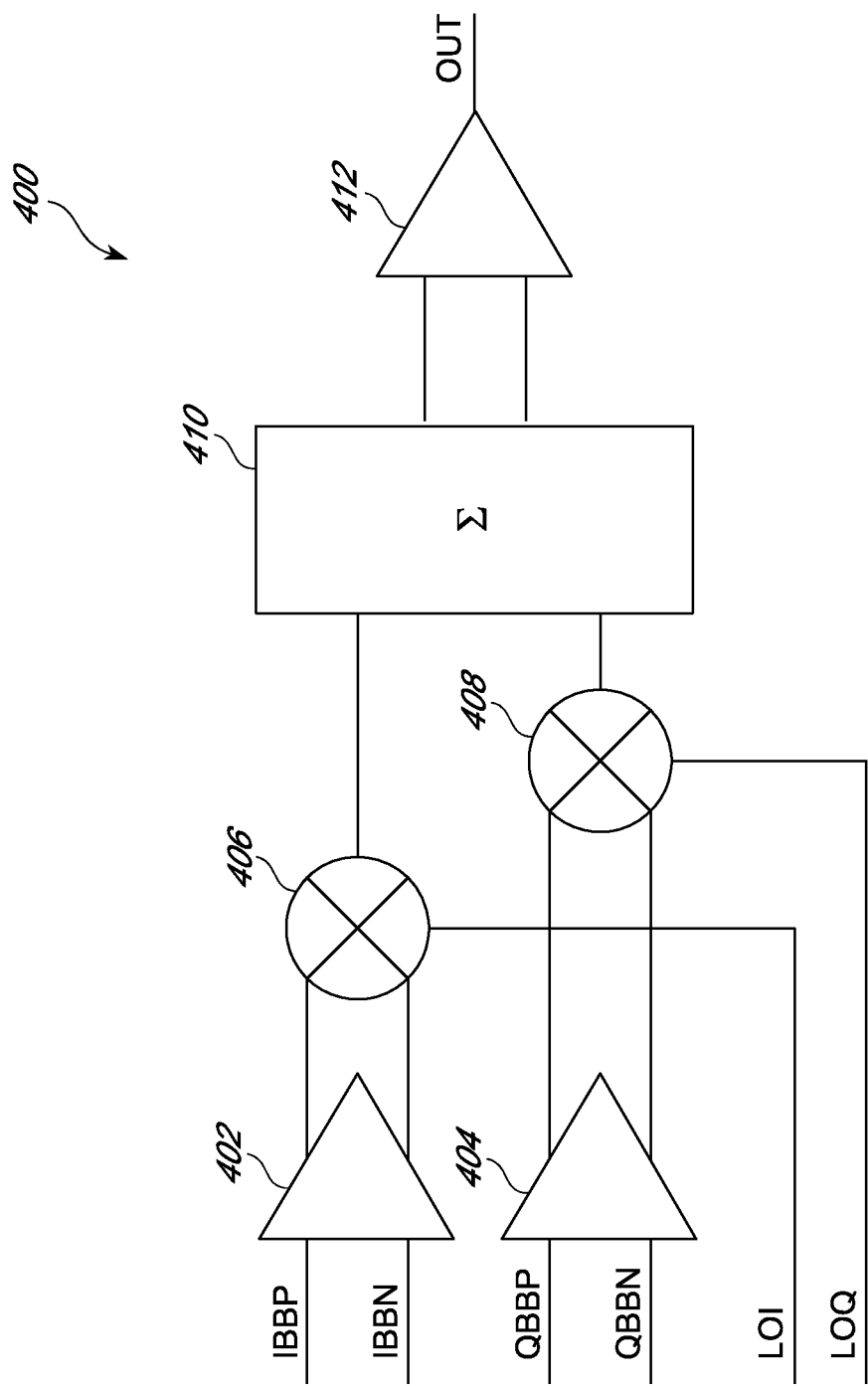
FIG. 4 illustrates an example of a quadrature modulator embodying two current buffer circuits.

FIG. 4 illustrates an example of a quadrature modulator 400 embodying two current buffer circuits 402, 404. Of course, a simple radio frequency (RF) modulator without quadrature can also be implemented. The quadrature modulator 400 further includes a first mixer 406, a second mixer 408, a summing circuit 410, and a differential-to-single-ended stage 412. The quadrature modulator 400 can be fabricated on an integrated circuit. The current buffer circuits 402, 404 can correspond to either the current buffer 200 or the current buffer 300 described earlier in connection with FIGS. 2 and 3. The inputs can be either baseband or intermediate frequency. The first current buffer circuit 402 receives a first baseband input signal IBBP, IBBN in differential form intended for the in-phase channel. The second current buffer circuit 404 receives a second baseband input signal QBBP, QBBN in differential form intended for the quadrature-phase channel. A typical source for the first baseband input signal IBBP, IBBN or the second baseband input signal QBBP, QBBN is a digital-to-analog converter with current outputs. There can also be LC filters disposed in the signal path between the digital-to-analog converters and the current buffer circuits 402, 404.

The current-mode outputs of the first current buffer circuit 402 and the second current buffer circuit 404 are provided as inputs to a first mixer 406 and to a second mixer 408. The mixers 406, 408 can be double-balanced mixers and implemented by Gilbert cells. The first mixer 406 is driven by an in-phase local oscillator signal LOI, and the second mixer 408 is driven by a quadrature-phase local oscillator signal LOQ. The quadrature modulator 400 can further include a phase splitter for generating one of the LOI signal or the LOQ signal from the other.

The mixers 406, 408 operate at higher speeds than the current buffer circuits 402, 404. Accordingly, in one embodiment, the mixers 406, 408 are implemented with NPN bipolar transistors or with NMOS transistors for better speed than with PNP bipolar transistors or with PMOS transistors, the transistors 204, 202 (FIG. 2) are implemented with PNP bipolar transistors or with PMOS transistors, and the transistors 206, 208 (FIG. 2) are implemented with NPN bipolar transistors or with NMOS transistors. In an alternative embodiment (not shown), the mixers 406, 408 are implemented with PNP bipolar transistors or with PMOS transistors, the transistors 204, 202 (FIG. 2) are implemented with NPN bipolar transistors or with NMOS transistors, and the transistors 206, 208 (FIG. 2) are implemented with PNP bipolar transistors or with PMOS transistors, with reversal of current direction and swapping of power supply biases.

The outputs of the mixers 406, 408 can be differential currents. These currents can be summed in a load by the summing circuit 410 to generate a quadrature-modulated signal, which can then be converted from differential form to single-ended form by the a differential-to-single-ended stage 412 and then provided as an output for, for example, power amplification.

Embodiments of the invention exhibit improved linearity and reduced intermodulation distortion, reduced thermal noise, and improved common-mode rejection characteristics. These improvements can, for example, be used to increase the dynamic range performance and improve the spectral purity of the output of an RF modulator, such as quadrature modulator, incorporating the buffer circuits. Of course, the use of current buffer circuits is ubiquitous and the current buffer circuits can be used in other devices, such as, but not limited to analog-to-digital converters, digital-to-analog converters, demodulators, and as the input for baseband, IF, and RF amplifiers.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

As used herein, a "node" refers to any internal or external reference point, connection point, junction, signal line, conductive element, or the like at which a given signal, logic level, voltage, data pattern, current, or quantity is present.

The MOS transistors described herein can correspond to transistors known as metal-oxide-semiconductor field-effect transistors (MOSFETs). While the terms "metal" and "oxide" are present in the name of the device, it will be understood that these transistors can have gates made out of materials other than metals, such as polysilicon, and that the dielectric oxide region can also be implemented not just with silicon oxide, but with other dielectrics, such as high-k dielectrics.

Various embodiments have been described above. Although described with reference to these specific embodiments, the descriptions are intended to be illustrative and are not intended to be limiting. Various modifications and applications may occur to those skilled in the art.

What is claimed is:

1. An apparatus comprising:
a first current buffer comprising:
   a first input configured to receive a non-inverted input signal current;
   a second input configured to receive an inverted input signal current;
   a first transistor of a first type, the first transistor having a base, an emitter, and a collector or a gate, a source, and a drain, wherein the base or gate of the first transistor is coupled to the first input;
   a second transistor of the first type, the second transistor having a base, an emitter, and a collector or a gate, a source, and a drain, wherein the base or gate of the second transistor is coupled to the second input;
   a first current source having an end coupled to the emitter or source of the first transistor;
   a second current source having an end coupled to the emitter or source of the second transistor;
   a first resistor having a first end coupled to the base or gate of the first transistor and a second end coupled to a reference voltage;
   a second resistor having a first end coupled to the base or gate of the second transistor and a second end coupled to the reference voltage;
   a third transistor of a second type different from the first type, the third transistor having a base, an emitter, and a collector or a gate, a source, and a drain, wherein the base or gate of the third transistor is coupled to the emitter or source of the first transistor, wherein the emitter or source of the third transistor is coupled to the base or gate of the second transistor, wherein the collector or drain of the third transistor is configured to provide a non-inverted output current signal; and
   a fourth transistor of the second type, the fourth transistor having a base, an emitter, and a collector or a gate, a source, and a drain, wherein the base or gate of the fourth transistor is coupled to the emitter or source of the second transistor, wherein the emitter or source of the fourth transistor is coupled to the base or gate of the first transistor, wherein the collector or drain of the fourth transistor is configured to provide an inverted output current signal.

2. The apparatus of claim 1, wherein the first type corresponds to a PNP bipolar transistor type, wherein the second type corresponds to an NPN bipolar transistor type, wherein the first current source and the second current source are configured to source current.

3. The apparatus of claim 1, wherein the first type corresponds to an NPN bipolar transistor type, wherein the second type corresponds to a PNP bipolar transistor type, and wherein the first current source and the second current source are configured to sink current.

4. The apparatus of claim 1, wherein the first resistor and the second resistor each have a resistance in the range of about 1 to about 10,000 ohms.

5. The apparatus of claim 1, wherein the first resistor and the second resistor each have a resistance in the range of about 2 to about 2,000 ohms.

6. The apparatus of claim 1, wherein the first resistor and the second resistor each have a resistance in the range of about 5 to about 5,000 ohms.

7. The apparatus of claim 1, wherein the first resistor and the second resistor each have a resistance of about 25 ohms.

8. The apparatus of claim 1, further comprising:
a third resistor; and
a fourth resistor;
wherein the base or gate of the first transistor is indirectly coupled to the first input via the third resistor; and
wherein the base or gate of the second transistor is indirectly coupled to the second input via the fourth resistor;
wherein the third resistor and the fourth resistor correspond to an explicit resistance.

9. The apparatus of claim 8, wherein the third resistor and the fourth resistor each have a resistance that is in the range of about 1 ohm to about 100 ohms.

10. The apparatus of claim 8, wherein the third resistor and the fourth resistor each have a resistance that is in the range of about 1 ohm to about 10 ohms.

11. The apparatus of claim 8, wherein the third resistor and the fourth resistor each have a resistance that is about 2.5 ohms.

12. The apparatus of claim 1, wherein the first type corresponds to a P-type MOS transistor type, wherein the second type corresponds to an N-type MOS transistor type, wherein the first current source and the second current source are configured to source current.

13. The apparatus of claim 1, wherein the first type corresponds to an N-type MOS transistor type, wherein the second type corresponds to a P-type MOS transistor type, and wherein the first current source and the second current source are configured to sink current.

14. The apparatus of claim 1, further comprising:
wherein the non-inverted input signal current and the inverted input signal current of the first current buffer correspond to in-phase signals;
a second current buffer substantially identical to the first current buffer, wherein the second current buffer is configured to receive quadrature phase signals and to generate a non-inverted output current signal and an inverted output current signal as outputs;
a first mixer configured to mix the non-inverted output current signal and the inverted output current signal of the first current buffer with an in-phase local oscillator signal to generate a first radio frequency (RF) modulated signal;
a second mixer configured to mix the non-inverted output current signal and the inverted output current signal of the second current buffer with a quadrature phase local oscillator signal to generate a second RF modulated signal; and
a summing circuit configured to combine the first RF modulated signal and the second RF modulated signal to generate a quadrature modulated signal.

15. The apparatus of claim 14, further comprising:
a first digital-to-analog converter having a differential current output, wherein the first digital-to-analog converter is configured to receive a first digital baseband signal and to generate the non-inverted input signal current and the inverted input signal current for the first current buffer; and
a second digital-to-analog converter having a differential current output, wherein the second digital-to-analog converter is configured to receive a second digital baseband signal and to generate the non-inverted input signal current and the inverted input signal current for the second current buffer.

16. The apparatus of claim 1, further comprising a first mixer configured to mix the non-inverted output current signal and the inverted output current signal of the first current buffer with a local oscillator signal to generate a radio-frequency modulated signal.

17. An apparatus comprising:
a first current buffer comprising:
a first buffer circuit comprising at least an input stage cascaded with an output stage, wherein the input stage has a first input node configured to receive a non-inverted input signal current of a differential input signal, wherein the output stage has a low-impedance node and a first output node, wherein the output stage is configured to generate a non-inverted output signal at the first output node;
a second buffer circuit comprising at least an input stage cascaded with an output stage, wherein the input stage has a second input node configured to receive an inverted input signal current of the differential input signal, wherein the output stage has a low-impedance node and a second output node, wherein the output stage is configured to generate an inverted output signal at the second output node; and
a cross-coupled feedback circuit configured to connect the low-impedance node of the second buffer circuit to the first input node and to connect the low-impedance node of the first buffer circuit to the second input node such that the first input node and the second input node are configured to have input impedances less than input impedances without the presence of the cross-coupled feedback circuit.

18. The apparatus of claim 17:
wherein the input stage of the first buffer circuit comprises an emitter follower or a source follower of a first transistor type, wherein the output stage of the first buffer circuit comprises a transistor of a second transistor type different from the first transistor type;
wherein the input stage of the second buffer circuit comprises an emitter follower or a source follower of the first transistor type, and the output stage of the second buffer circuit comprises a transistor of the second transistor type.

19. The apparatus of claim 17, further comprising:
wherein the non-inverted input signal current and the inverted input signal current of the first current buffer correspond to in-phase signals;
a second current buffer substantially identical to the first current buffer, wherein the second current buffer is configured to receive quadrature phase signals and to generate a non-inverted output current signal and an inverted output current signal as outputs;
a first mixer configured to mix the non-inverted output current signal and the inverted output current signal of the first current buffer with an in-phase local oscillator signal to generate a first radio frequency (RF) modulated signal;
a second mixer configured to mix the non-inverted output current signal and the inverted output current signal of the second current buffer with a quadrature phase local oscillator signal to generate a second RF modulated signal; and
a summing circuit configured to combine the first RF modulated signal and the second RF modulated signal to generate a quadrature modulated signal.

20. The apparatus of claim 19, further comprising:
a first digital-to-analog converter having a differential current output, wherein the first digital-to-analog converter is configured to receive a first digital baseband signal and to generate the non-inverted input signal current and the inverted input signal current for the first current buffer; and
a second digital-to-analog converter having a differential current output, wherein the second digital-to-analog converter is configured to receive a second digital baseband signal and to generate the non-inverted input signal current and the inverted input signal current for the second current buffer.

21. The apparatus of claim 17, further comprising a mixer configured to mix the non-inverted output current signal and the inverted output current signal of the first current buffer with a local oscillator signal to generate a radio frequency modulated signal.

22. An apparatus comprising:
a first current buffer comprising:
a first buffer circuit comprising at least an input stage cascaded with an output stage, wherein the input stage has a first input node configured to receive a non-inverted input signal current of a differential input signal, wherein the output stage has a low-impedance node and a first output node, wherein the output stage is configured to generate a non-inverted output signal at the first output node;

a second buffer circuit comprising at least an input stage cascaded with an output stage, wherein the input stage has a second input node configured to receive an inverted input signal current of the differential input signal, wherein the output stage has a low-impedance node and a second output node, wherein the output stage is configured to generate an inverted output signal at the second output node; and a means for cross-coupling feedback from the low-impedance node of the second buffer circuit to the first input node and from the low-impedance node of the first buffer circuit to the second input node such that an input impedance of the first input node and an input impedance of the second input node are less than the input impedances without the presence of the cross-coupled feedback circuit.

23. The apparatus of claim 22, further comprising:

wherein the non-inverted input signal current and the inverted input signal current of the first current buffer correspond to in-phase signals;

a second current buffer substantially identical to the first current buffer, wherein the second current buffer is configured to receive quadrature phase signals and to generate a non-inverted output current signal and an inverted output current signal as outputs;

a first mixer configured to mix the non-inverted output current signal and the inverted output current signal of the first current buffer with an in-phase local oscillator signal to generate a first radio frequency (RF) modulated signal;

a second mixer configured to mix the non-inverted output current signal and the inverted output current signal of the second current buffer with a quadrature phase local oscillator signal to generate a second RF modulated signal; and a summing circuit configured to combine the first RF modulated signal and the second RF modulated signal to generate a quadrature modulated signal.

24. The apparatus of claim 22, further comprising a first mixer configured to mix the non-inverted output current signal and the inverted output current signal of the first current buffer with a local oscillator signal to generate a radio frequency modulated signal.

25. A method for buffering current, the method comprising:

receiving a non-inverted input signal current of a differential input signal at a first input node of an input stage of a first buffer circuit, wherein the first buffer circuit further comprises an output stage cascaded with the input stage, wherein the output stage has a low-impedance node and a first output node;

generating a non-inverted output signal at the first output node from the non-inverted input signal current;

receiving an inverted input signal current of the differential input signal at a second input node of an input stage of a second buffer circuit, wherein the second buffer circuit further comprises an output stage cascaded with the input stage, wherein the output stage has a low-impedance node and a second output node;

generating an inverted output signal at the second output node from the inverted input signal current; and cross-coupling feedback from the low-impedance node of the second buffer circuit to the first input node and from the low-impedance node of the first buffer circuit to the second input node such that an input impedance of the first input node and an input impedance of the input second node are less than the input impedances without the presence of the cross-coupled feedback circuit.

26. The method of claim 25:

wherein the input stage of the first buffer circuit comprises an emitter follower or a source follower of a first transistor type, wherein the output stage of the first buffer circuit comprises a transistor of a second transistor type different from the first transistor type;

wherein the input stage of the second buffer circuit comprises an emitter follower or a source follower of the first transistor type, and the output stage of the second buffer circuit comprises a transistor of the second transistor type.

27. The method of claim 25, further comprising:

wherein the non-inverted input signal current and the inverted input signal current of the first buffer circuit correspond to in-phase signals;

receiving a non-inverted input signal current of a differential input signal at a third input node of an input stage of a third buffer circuit, wherein the third buffer circuit further comprises an output stage cascaded with the input stage, wherein the output stage has a low-impedance node and a third output node;

generating a non-inverted output signal at the third output node from the non-inverted input signal current;

receiving an inverted input signal current of the differential input signal at a fourth input node of an input stage of a fourth buffer circuit, wherein the fourth buffer circuit further comprises an output stage cascaded with the input stage, wherein the output stage has a low-impedance node and a fourth output node;

generating an inverted output signal at the fourth output node from the inverted input signal current;

cross-coupling feedback from the low-impedance node of the fourth buffer circuit to the third input node and from the low-impedance node of the third buffer circuit to the fourth input node such that an input impedance of the third input node and an input impedance of the fourth input node are less than the input impedances without the presence of the cross-coupled feedback circuit;

mixing the non-inverted output current signal and the inverted output current signal of the first buffer circuit with an in-phase local oscillator signal to generate a first RF modulated signal;

mixing the non-inverted output current signal and the inverted output current signal of the second buffer circuit with a quadrature phase local oscillator signal to generate a second RF modulated signal; and combining the first RF modulated signal and the second RF modulated signal to generate a quadrature modulated signal.

28. The method of claim 27, further comprising:

receiving a first digital baseband signal;

generating the non-inverted input signal current and the inverted input signal current for the first buffer circuit by conversion of digital to analog;

receiving a second digital baseband signal; and generating the non-inverted input signal current and the inverted input signal current for the second buffer circuit by conversion of digital to analog.

29. The method of claim 25, further comprising mixing the non-inverted output current signal and the inverted output current signal of the first buffer circuit with a local oscillator signal to generate a radio frequency modulated signal.

\* \* \* \* \*